(12) United States Patent
Senisi

(10) Patent No.: US 9,633,812 B1
(45) Date of Patent: Apr. 25, 2017

(54) TRIODE TUBE EMULATOR CIRCUIT

(71) Applicant: William J. Senisi, Schenectady, NY (US)

(72) Inventor: William J. Senisi, Schenectady, NY (US)

( * ) Notice: Subject to any disclaimer, the term of this patent is extended or adjusted under 35 U.S.C. 154(b) by 0 days.

(21) Appl. No.: 15/281,768

(22) Filed: Sep. 30, 2016

(51) Int. Cl.
*H01J 19/78* (2006.01)
*H01J 21/10* (2006.01)

(52) U.S. Cl.
CPC .............. *H01J 19/78* (2013.01); *H01J 21/10* (2013.01)

(58) Field of Classification Search
CPC ..................... H03F 1/327; H03F 2200/549
See application file for complete search history.

(56) References Cited

U.S. PATENT DOCUMENTS

| | | | | |
|---|---|---|---|---|
| 7,408,401 B1* | 8/2008 | Roberts | ................... | H03F 1/327 330/3 |
| 8,271,109 B2* | 9/2012 | Gallo | ..................... | G10H 3/187 381/61 |
| 8,275,477 B2* | 9/2012 | Gallo | ................... | G10H 1/0091 381/61 |

* cited by examiner

*Primary Examiner* — Jeffrey Zweizig
(74) *Attorney, Agent, or Firm* — K&L Gates LLP

(57) ABSTRACT

Various examples are directed to analog vacuum tube emulator circuits. In various examples, a vacuum tube emulator circuit may comprise a first circuit and a second circuit. The first circuit may be effective to receive, a first voltage, a second voltage, and a third voltage. The first circuit may be effective to develop, at an input of the first circuit, a first current based on the first voltage, the second voltage, and the third voltage. The first circuit may output the first current to an output node. The second circuit may be effective to receive the first voltage, the second voltage, and the third voltage. The second circuit may be effective to develop, at an input of the second circuit, a second current based on the first voltage, the second voltage, and the third voltage. The second circuit may output the second current to the output node.

14 Claims, 13 Drawing Sheets

TRIODE TUBE EMULATOR CIRCUIT

BACKGROUND

Vacuum tubes are devices that control electric current between electrodes in an evacuated container or "tube". Triode vacuum tubes include an electron emitting cathode, a plate which serves as an anode, and a control grid. The control grid ("grid") allows the current between the cathode and the anode to be controlled by the voltage on the grid. Triode vacuum tubes have many applications and can be used in electronic devices for amplification, rectification, switching, oscillation, and display. In many respects, triode vacuum tubes have been replaced by solid state electronics. However, in certain applications triode vacuum tubes are preferred over solid state devices. For example, vacuum tubes are still widely used in audio electronics, especially guitar amplifiers. Vacuum tubes exhibit particular distortion profiles and sounds when used in audio electronics. However, the relatively short lifespan, high cost, and bulkiness of vacuum tubes makes solid state alternatives desirable.

DETAILED DESCRIPTION

In the following description, reference is made to the accompanying drawings, which illustrate several examples of the present invention. It is understood that other examples may be utilized and various operational changes may be made without departing from the spirit and scope of the present disclosure. The following detailed description is not to be taken in a limiting sense, and the scope of the embodiments of the present invention is defined only by the claims of the issued patent.

Figure 1:
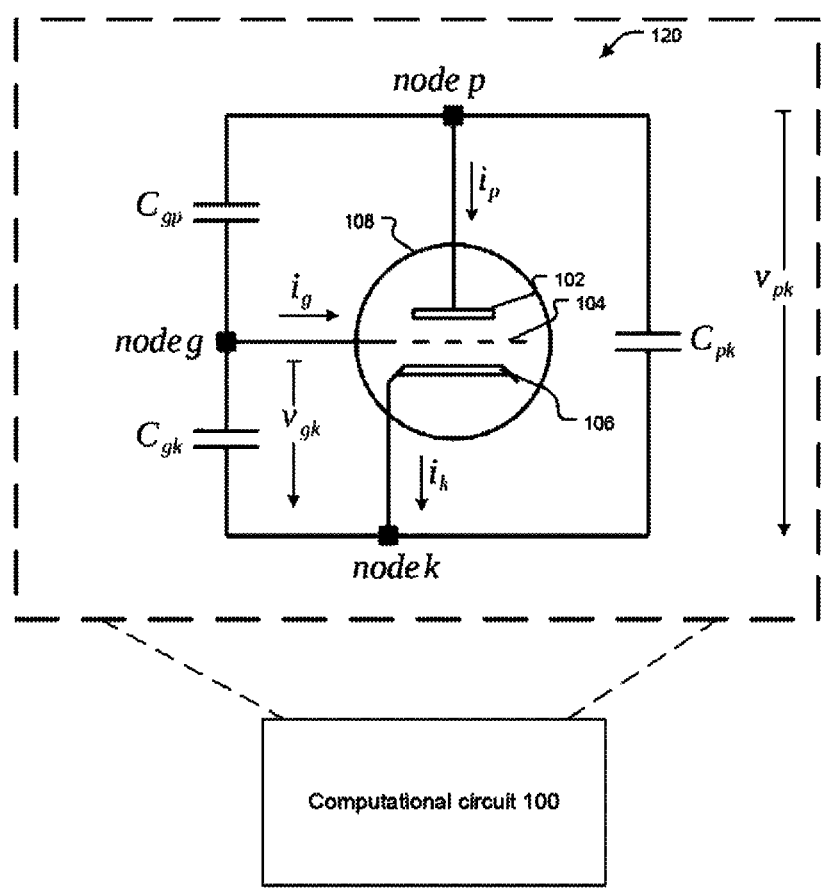
FIG. 1 is a diagram showing an example computational circuit configured to emulate a triode vacuum tube.
Figure 2:
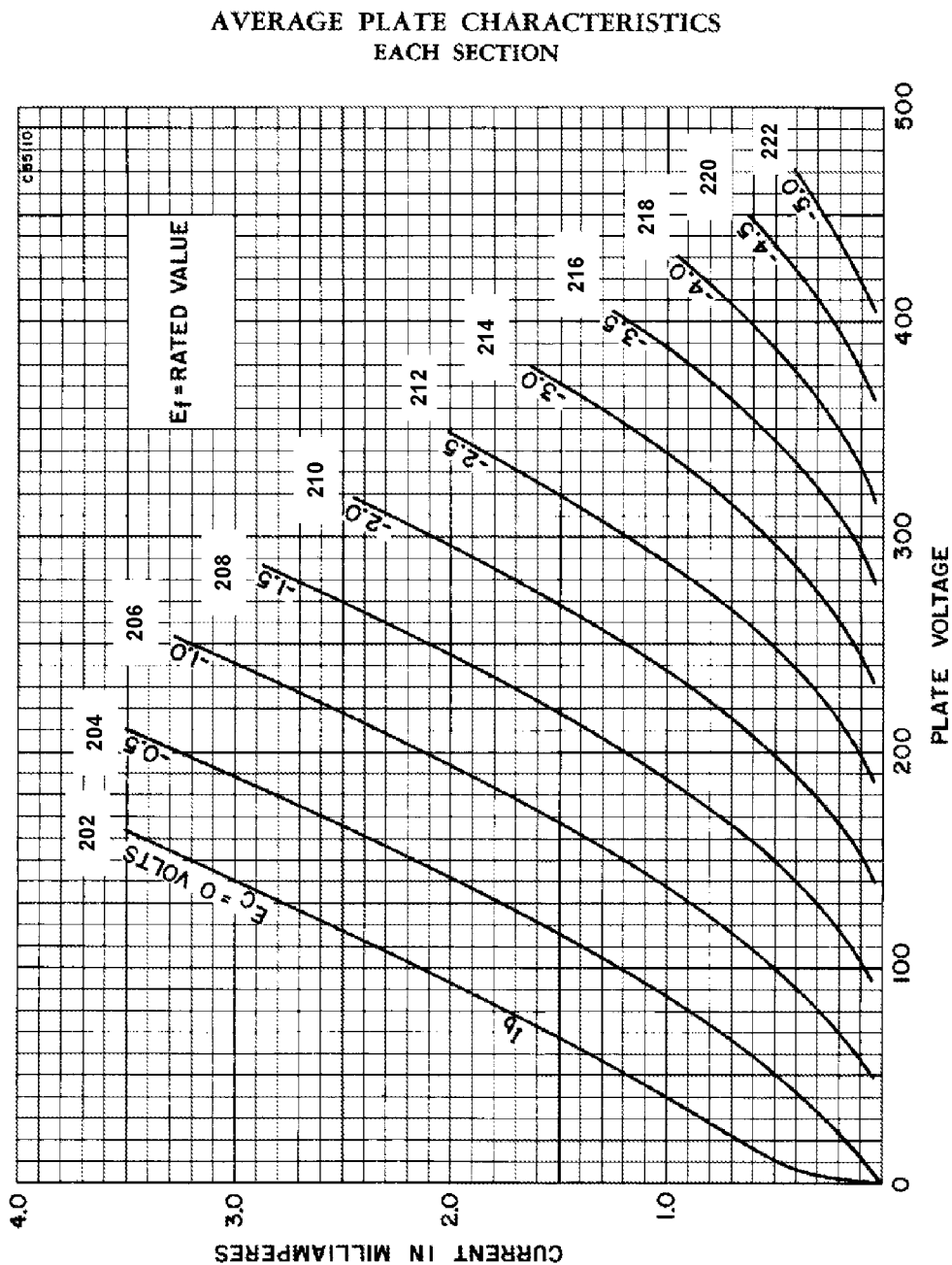
FIG. 2 depicts the current-voltage relationship for plate current of a particular triode vacuum tube.

FIG. 1 is a diagram showing an example of a computational circuit 100 configured to emulate a triode vacuum tube 120. A triode vacuum tube 120 includes three nodes, a plate node ("node p"), a grid node ("node g"), and a cathode node ("node k"). Node p is electrically coupled to the plate 102 of the triode vacuum tube 120. Plate 102 serves as the anode of triode vacuum tube 120. Node k is electrically coupled to the electron emitting cathode 106 of a triode vacuum tube 120. Node g is electrically coupled to the grid 104 of a triode vacuum tube 120. The electron flow from cathode 106 to plate 102 (i.e. the conventional current from plate 102 to cathode 106) is a function of grid-to-cathode voltage $v_{gk}$ and plate-to-cathode voltage $v_{pk}$. FIG. 2 depicts the average plate characteristics for a particular triode vacuum tube—the SYLVANIA 12AX7 dual triode. The electron flow from cathode 106 to grid 104 (e.g., the conventional current from grid 104 to cathode 106) is a function of grid-to-cathode voltage $v_{gk}$ and plate-to-cathode voltage $v_{pk}$. The 12AX7 dual triode is a commonly used preamplifier tube for audio equipment. In various embodiments described herein, computational circuit 100 is effective to emulate the characteristics of the 12AX7 dual triode. Depending on the desired implementation, computational circuit 100 may be designed in such a way as to emulate the characteristics of any triode vacuum tube, as described in further detail below.

FIG. 2 depicts the current-voltage relationship for plate current of a particular triode vacuum tube, in accordance with an embodiment of the present disclosure. In FIG. 2, $v_{gk}$ is held constant for each curve (including curves 202, 204, 206, 208, 210, 212, 214, 216, 218, 220 and 222) while $v_{pk}$ is swept to obtain plate current characteristics of the 12AX7. As shown, the plate current resulting from a sweep of $v_{pk}$ is non-linear for any constant grid-to-cathode voltage $v_{gk}$. Accordingly, emulation of a triode vacuum tube such as the 12AX7 is a non-trivial task. A triode vacuum tube, such as the 12AX7 experiences parasitic capacitances between the various nodes (e.g., $C_{pk}$, $C_{gp}$, and $C_{gk}$). Such parasitic capacitances, in turn, affect the electrical characteristics of the triode vacuum tube and accordingly, must be taken into account when designing computational circuit 100, as described in further detail below.

Figure 3A:
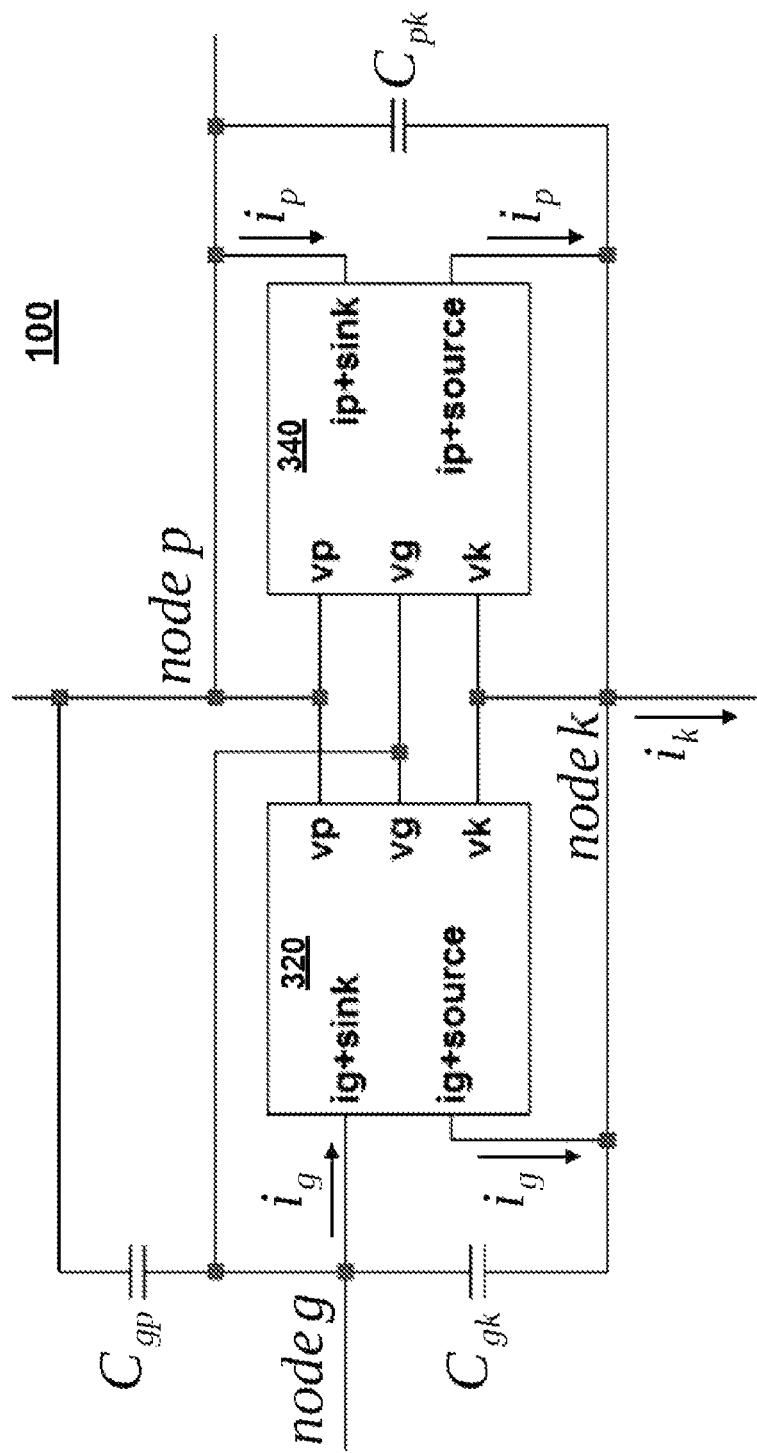
FIG. 3A depicts a schematic of a computational circuit effective to emulate the electrical characteristics of any triode vacuum tube, in accordance with various aspects of the present disclosure.

FIG. 3A depicts a schematic of a computational circuit effective to emulate the electrical characteristics of any triode vacuum tube, in accordance with various aspects of the present disclosure. Grid current emulator circuit 320 and plate current emulator circuit 340 may each receive voltage inputs $v_p$, $v_g$, and $v_k$ and may develop current outputs $i_g$ and $i_p$, respectively. As depicted, grid current emulator circuit 320 may develop current outputs $i_g$ which may be equal in magnitude, but opposite in direction. Current output $i_g$ may depend on voltages $v_p$, $v_g$, and $v_k$. Similarly, plate current emulator circuit 340 may develop output currents $i_p$ which may be equal in magnitude, but opposite in direction. Current $i_p$ may depend on voltages $v_p$, $v_g$, and $v_k$. The notation "+sink" represents positive conventional current (e.g., current moving in the direction of positive charge flow opposite the flow of electrons) entering into the dependent current source (e.g., grid current emulator circuit 320 and/or plate current emulator circuit 340). The notation "+source" represents positive conventional current leaving the dependent current source. The ideal input impedance at $v_p$, $v_g$, and $v_k$ is infinity. Similarly, the ideal output impedance of all current outputs is infinity.

To continue the example, an empirically determined mathematical model of the grid current ($i_g$) of the 12AX7 is given by equation (1):

$$i_g = \frac{(K_1 v_{gk} - K_2 v_{pk} + K_3) + \sqrt{(K_1 v_{gk} - K_2 v_{pk} + K_3)^2 + 4(K_4)^2}}{2} \mu A \quad (1)$$

An empirically determined mathematical model of the plate current ($i_p$) of the 12AX7 is given by equation (2):

$$i_p = K_5 \left( \frac{(v_{pk} - v_\pi) + \sqrt{(v_{pk} - v_\pi)^2 + 4(v_\lambda)^2}}{2 v_\lambda} \right)^P mA \text{ where:} \quad (2)$$

$$v_\pi = -\frac{(K_6 v_{gk} + K_7) + \sqrt{(K_6 v_{gk} + K_7)^2 + 4(K_8)^2}}{2} + K_9 \text{ and}$$

$$v_\lambda = \frac{(K_{10} v_{gk} + K_{11}) + \sqrt{(K_{10} v_{gk} + K_{11})^2 + 4(K_{12})^2}}{2} + K_{13}$$

Kirchhoff's Current Law dictates that the cathode current ($i_k$) of the 12AX7 is given by equation (3):

$$i_k = i_p + i_g \quad (3)$$

Table 1 displays constants $K_1$–$K_{13}$ and P for the SYLVANIA 12AX7. For other triode tubes, different constants may be determined using a curve-fitting analysis and substituted for the values in the table below.

| Constant | Value |
|---|---|
| $K_1$ | 555 V$^{-1}$ |
| $K_2$ | .46 V$^{-1}$ |
| $K_3$ | 38.33 |
| $K_4$ | 30 |
| $K_5$ | .03 |
| $K_6$ | 115.6 |
| $K_7$ | 1047.336 V |
| $K_8$ | 585.9 V |
| $K_9$ | 1264.78 V |
| $K_{10}$ | −1.45 |
| $K_{11}$ | −2.7115 V |
| $K_{12}$ | 1.12 V |
| $K_{13}$ | 6.51 V |
| P | 1.4 |

Referring again to computational circuit 100 in FIG. 3A, it should be appreciated that there are many different specific hardware implementations of the grid current emulator circuit 320 and plate current emulator circuit 340 that can achieve the voltage-current relationships of computational circuit 100. In an illustrative example, for a computational circuit 100 designed to emulate the voltage-current relationships of the 12AX7 dual triode, grid current emulator circuit 320 and plate current emulator circuit 340 may be designed so as to take $v_p$, $v_g$, and $v_k$ as inputs and compute currents $i_g$ and $i_p$ respectively in accordance with equations (1) and (2).

Furthermore, physical capacitor components may be used in computational circuit 100 depicted in FIG. 3A to account for the parasitic capacitances $C_{gk}$, $C_{gp}$, and $C_{pk}$ of the 12AX7. The parasitic capacitances specified by the data sheet of the 12AX7 manufactured by SYLVANIA are $C_{gk}$=1.6 pF, $C_{gp}$=1.7 pF, and $C_{pk}$=0.46 pF. Accordingly, capacitor components may be used to approximate these capacitances in computational circuit 100.

Figure 3B:
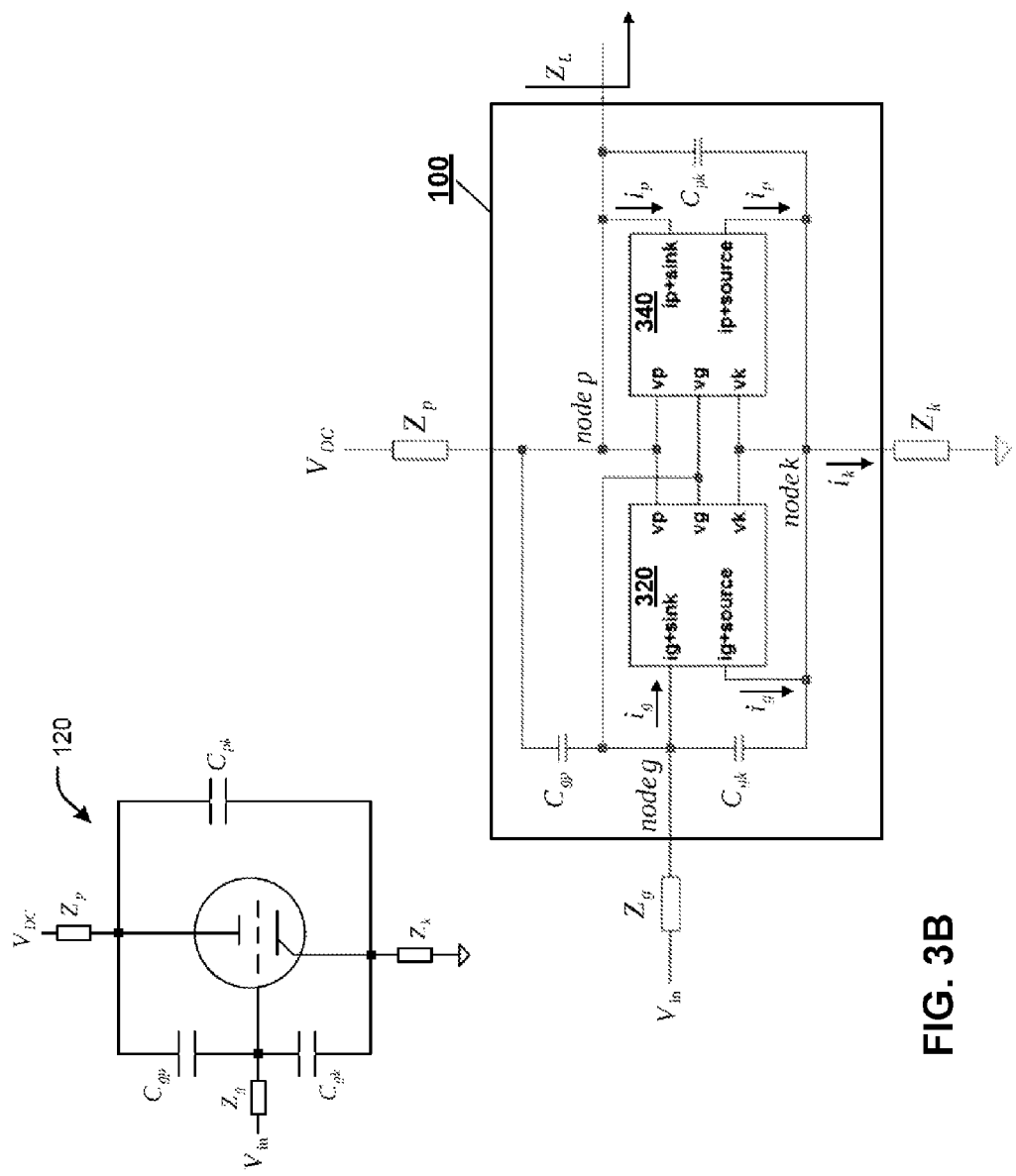
FIG. 3B depicts the computational circuit of FIG. 3A with impedances connected to various nodes, in accordance with various aspects of the present disclosure.

FIG. 3B depicts an example configuration of a tube stage for illustrative purposes. In FIG. 3B, the computational circuit of FIG. 3A is shown with impedances coupled to various nodes, in accordance with various aspects of the present disclosure. Typically the input voltage is applied to an impedance that is connected to the grid and the output voltage is taken from the plate. The impedance connected from $v_{in}$ to the grid generally contains at least a resistive element known as the grid stopper resistance. The impedance connected from $v_k$ to the ground generally contains at least a resistive element that sets the DC bias of the stage. The impedance connected from the power supply to the plate generally contains at least a resistive element that sets the DC load line and in conjunction with $Z_k$ sets the gain of the stage. FIG. 3B also depicts similar impedances coupled to the plate, grid, and cathode nodes of a triode vacuum tube 120, for illustrative purposes.

In FIG. 3B, Kirchhoff's current law (KCL) may be used at each node (including node g, node p, and node k) of computational circuit 100 to determine a set of equations which, when solved, provides a model for the full transfer characteristics of any triode vacuum tube. For example, any impedances may be connected to the emulation circuit depicted in FIG. 3A to solve the system of equations for those impedances. By connecting impedances $Z_g$, $Z_p$, and $Z_L$ to the computational circuit 100 depicted in FIG. 3A equations (4), (5), and (6) are solved.

For example, KCL at node g yields equation (4), which is solved by computational circuit 100:

$$\frac{v_{in} - v_g}{Z_g} = i_g + C_{gp} \frac{d v_{gp}}{dt} + C_{gk} \frac{d v_{gk}}{dt} \quad (4)$$

where $v_{in}$ represents an input voltage, $v_g$ represents the voltage at node g, $Z_g$ represents an input impedance at node g, and $i_g$ represents a current developed by grid current emulator circuit 320 based on input voltages $v_p$, $v_g$, and $v_k$.

$$C_{gp} \frac{d v_{gp}}{dt}$$

represents the current through the parasitic capacitance $C_{gp}$. Similarly, $$C_{gk} \frac{d v_{gk}}{dt}$$

represents the current through the parasitic capacitance $C_{gk}$.

KCL at node p yields equation (5), which is solved by computational circuit 100:

$$\frac{v_{dc} - v_p}{Z_p} = i_p + \frac{v_p}{Z_L} - C_{gp} \frac{d v_{gp}}{dt} + C_{pk} \frac{d v_{pk}}{dt} \quad (5)$$

where $v_{dc}$ represents a supply voltage, $v_p$ represents the voltage at node p, $Z_p$ represents a supply impedance at node p, $i_p$ represents a current developed by plate current emulator circuit 340 based on input voltages $v_p$, $v_g$, and $v_k$, and $Z_L$ represents a load impedance.

KCL at node k yields equation (6), which is solved by computational circuit 100:

$$\frac{v_k}{Z_k} = i_k + C_{gk}\frac{dv_{gk}}{dt} + C_{pk}\frac{dv_{pk}}{dt} \quad (6)$$

where $v_k$ represents the voltage at node k, $Z_k$ represents an impedance at node k, and $i_k$ represents a current developed based on the addition of currents $i_p$ and $i_g$.

The expression for $i_p$ shown in equation (1) may be substituted into equation (4) above. Similarly, the expression for $i_g$ shown in equation (2) may be substituted into equation (4). The expression for $i_k$ shown in equation (3) may be substituted into equation (6).

In various examples described below, in order to maintain reasonable voltage levels for practical applications, all node voltages (such as $v_p$, $v_g$, and $v_k$) may be divided by a value to reduce the node voltage magnitudes. For example, in various embodiments described herein the voltages $v_p$, $v_g$, and $v_k$ are divided by 100. To compensate for the changed voltages and to maintain constant current values, all impedances connected to $v_p$, $v_g$, and $v_k$ as well as the perceived input voltage and power supply voltages may similarly be divided by the same value. This effectively increases the transconductance of the system by a factor of 100, but maintains the ratio of voltage relationships between all nodes. Reduction of the voltages can prevent voltage swings on the order of hundreds of volts. Although such high voltage swings are common in vacuum tubes, in various circuits described herein, it may be necessary to scale down voltage swings as typical solid state devices may not be able to accommodate them.

Figure 4:
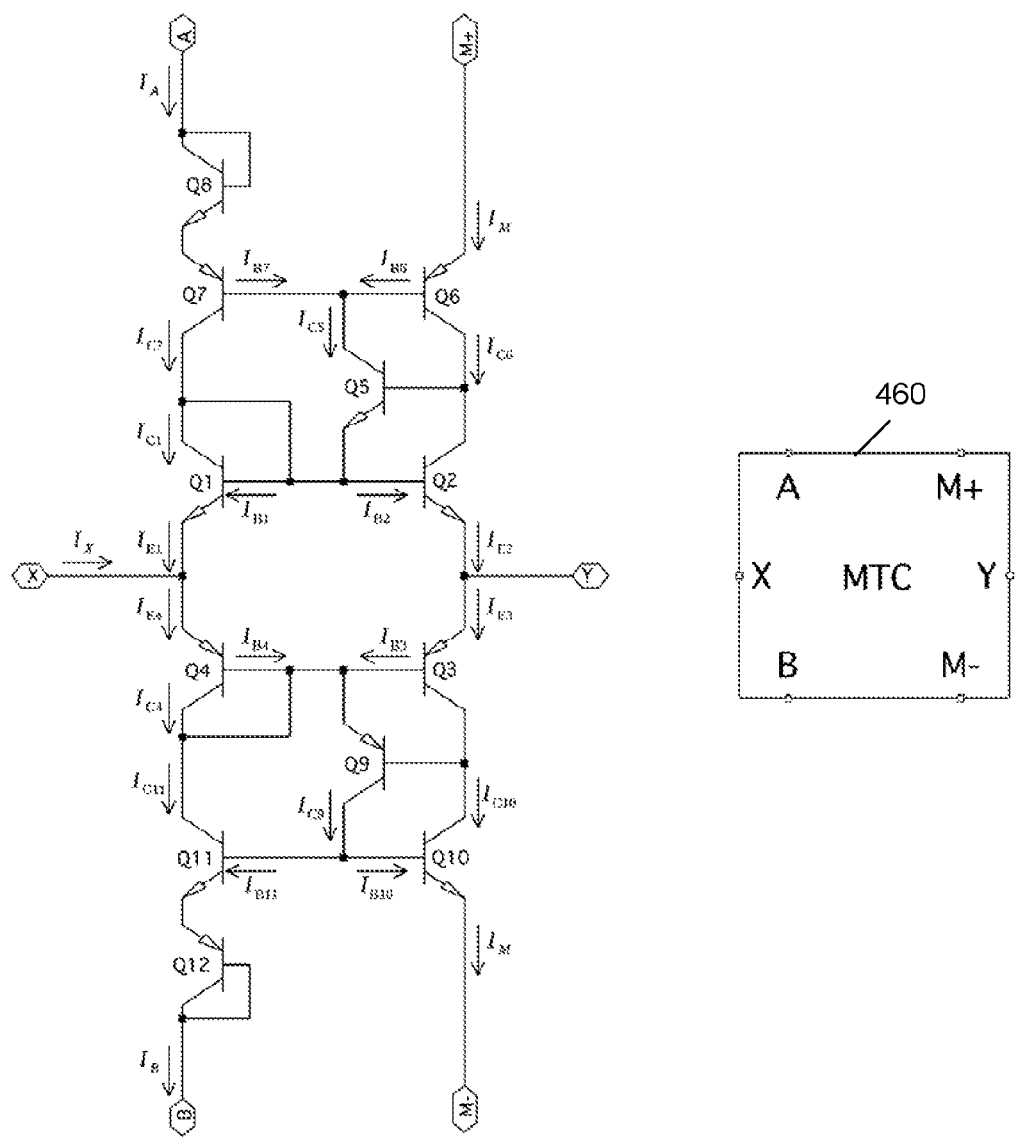
FIG. 4 depicts a mixed translinear cell, in accordance with various embodiments described herein.

FIG. 4 depicts a mixed translinear cell (MTC), a fundamental building block that will be referred to in the various schematics below. The MTC in FIG. 4 is made up of transistors Q1-Q4. Q1-Q4 form a translinear loop that can be written using KVL as follows:

$$v_T \ln\left(\frac{I_{C1}}{I_{SN}}\right) - v_T \ln\left(\frac{I_{C2}}{I_{SN}}\right) - v_T \ln\left(\frac{I_{C3}}{I_{SP}}\right) + v_T \ln\left(\frac{I_{C4}}{I_{SP}}\right) = 0.$$

If all NPN transistors are matched to each other, and all PNP transistors are matched to each other, then $$\frac{I_{E1}}{I_{E2}} = \frac{I_{E3}}{I_{E4}}$$

can be written. The goal is to force the same current (which will be referred to as $I_M$) through the emitters of Q2 and Q3 creating an infinite input impedance at Y and giving a relationship of $I_{E1}I_{E4}=(I_M)^2$ between the 4 currents of Q1-Q4. Then when inputting a current labeled $I_X$ into X which from KCL yields $I_X=I_{E4}-I_{E1}$, the combination of the 2 former equations leads to $$I_{E1} = \frac{-I_X + \sqrt{(I_X)^2 + 4(I_M)^2}}{2} \text{ and } I_{E4} = \frac{I_X + \sqrt{(I_X)^2 + 4(I_M)^2}}{2}.$$

Q5-Q12 are in place to reduce the error that would occur if the output at A (which is ideally $I_{E1}$) is taken from the collector of Q1, the output at B (which is ideally $I_{E4}$) is taken from the collector of Q4, current $I_M$ is sourced directly into the collector of Q2 (which is ideally $I_{E2}$), and/or current $I_M$ is sunk directly from the collector of Q3 (which is ideally $I_{E3}$).

Since the circuit is symmetrical, the placement of Q5-Q8 in the following analysis may be carried over to the explanation of Q9-Q12. Base current of Q5 is neglected since Q5 has two base currents flowing through it to begin with. This makes $I_{C2}=I_{C6}=I_M-I_{B6}$ and if it is assumed that $\beta_N \approx \beta_P$ then $I_{B6} \approx I_{B2}$, and since $I_{C7}=I_{E1}+I_{B2}-I_{B7}-I_{B6}$, $I_A=I_{C7}+I_{B7}$, and $I_{E2}=I_{C2}+I_{B2}$, it follows that $I_A=I_{E1}$, and $I_M=I_{E2}$.

Q8 is configured as a diode in order to reduce the voltage at $M_+$ so as to make sure the voltage at $M_+$ does not have the ability to go above the voltage at A. If a lower voltage at $M_+$ is desired based on the choice of power supply rail values or certain types of current mirror inputs it is trivial to cascade any number of diodes in this manner. It should be noted that the error this circuit will experience will mainly depend on the mismatch of $\beta$ between npn and pnp devices.

The following equations describe the ideal behavior of the circuit:

$$I_A = \frac{-I_X + \sqrt{(I_X)^2 + 4(I_M)^2}}{2}, I_B = \frac{I_X + \sqrt{(I_X)^2 + 4(I_M)^2}}{2}$$

for positive conventional current $I_X$ entering port X.
It should also be noted that $I_B-I_A=I_X$.

$$V_X = V_Y + v_T \ln\left(\frac{I_X + \sqrt{(I_X)^2 + 4(I_M)^2}}{2I_M}\right)$$

for positive conventional current $I_X$ entering port X and, $$V_X = V_Y - v_T \ln\left(\frac{I_X + \sqrt{(I_X)^2 + 4(I_M)^2}}{2I_M}\right)$$

for positive conventional current $I_X$ exiting port X, where Y has an infinite input impedance.

Since this building block will be used throughout the circuit many times it is represented with the corresponding symbol 460 in the various schematics described below.

Figure 5:
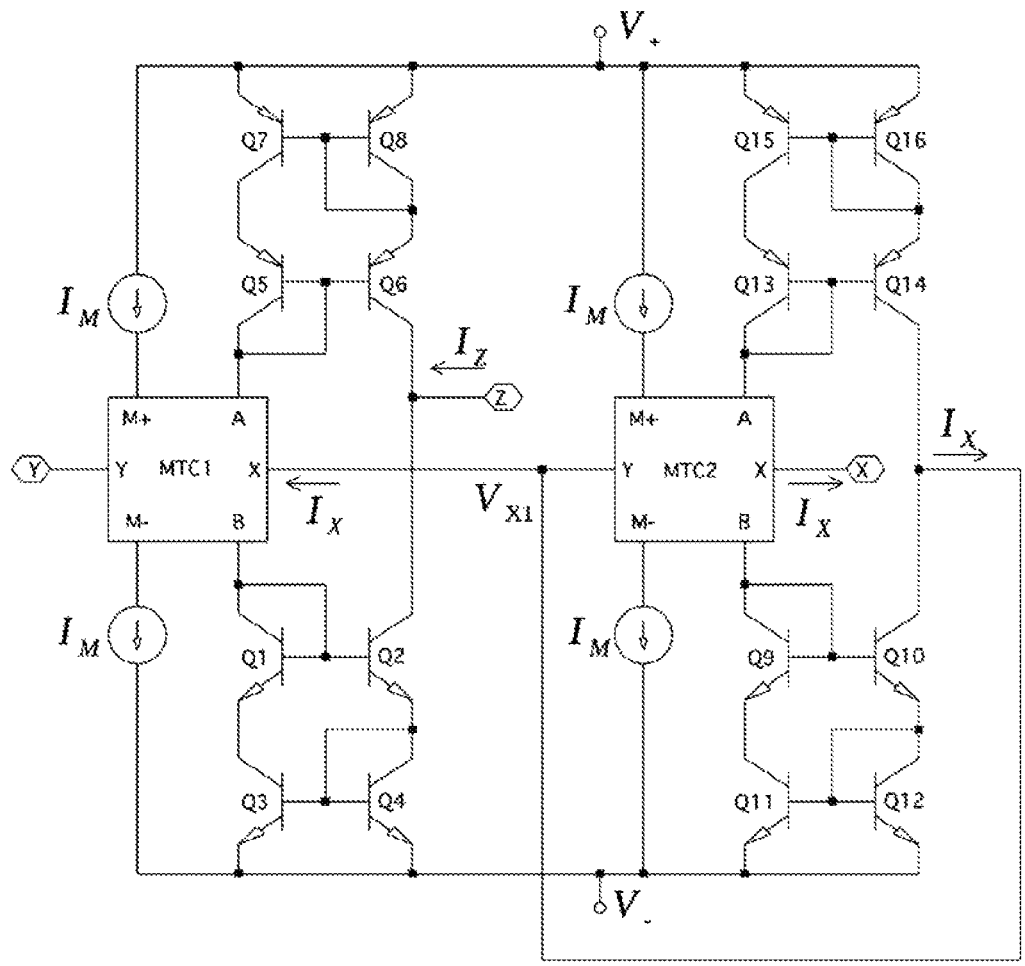
FIG. 5 depicts a second generation negative current conveyor, in accordance with various embodiments described herein.
Figure 5:
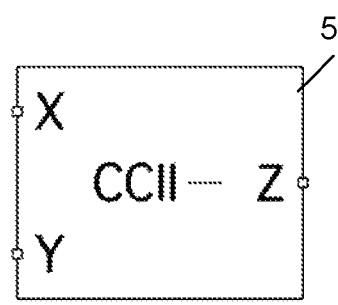

FIG. 5 depicts a Second Generation Negative Current Conveyor (CCII−).

Current Conveyors may comprise two mixed translinear cells (such as MTCs 460 of FIG. 4). Referring again to FIG. 5, voltage $V_Y$ may be placed at port Y of Mixed Translinear Cell MTC1 (used as the global port Y), giving node $V_{X1}$ the voltage $$V_{X1} = V_Y + v_T \ln\left(\frac{I_X + \sqrt{(I_X)^2 + 4(I_M)^2}}{2I_M}\right)$$

for $I_X$ entering port X of MTC1. This current is the same magnitude of the current that is leaving port X of MTC2, which produces a voltage at port X of MTC2 of $V_X = V_{X1} - v_T \ln\left(\dfrac{I_X + \sqrt{(I_X)^2 + 4(I_M)^2}}{2I_M}\right)$, which upon substituting in the preceding expression for $V_{X1}$ gives the relationship between port Y of MTC1 and port X of MTC2 as $V_X = V_Y$. Since $I_Z$ entering at port Z is a copy of $I_X$ leaving port X of MTC2, the relationship between the currents entering at port Z and port X is written as $I_Z = -I_X$. These relationships describe the behavior of a second generation negative current conveyor. The values of the $V_+$ and $V_-$ and magnitude of $I_M$ are inconsequential to the operation of the circuit so long as their magnitude is high enough to keep the transistors in the forward active region and the designer realizes the desired range of the voltages and currents in the circuit. With a lower $I_M$ the circuit operates in class A/B, and with a higher $I_M$ in class A. The circuit symbol 560 represents the second generation negative current conveyor in various subsequent schematics.

Figure 6:
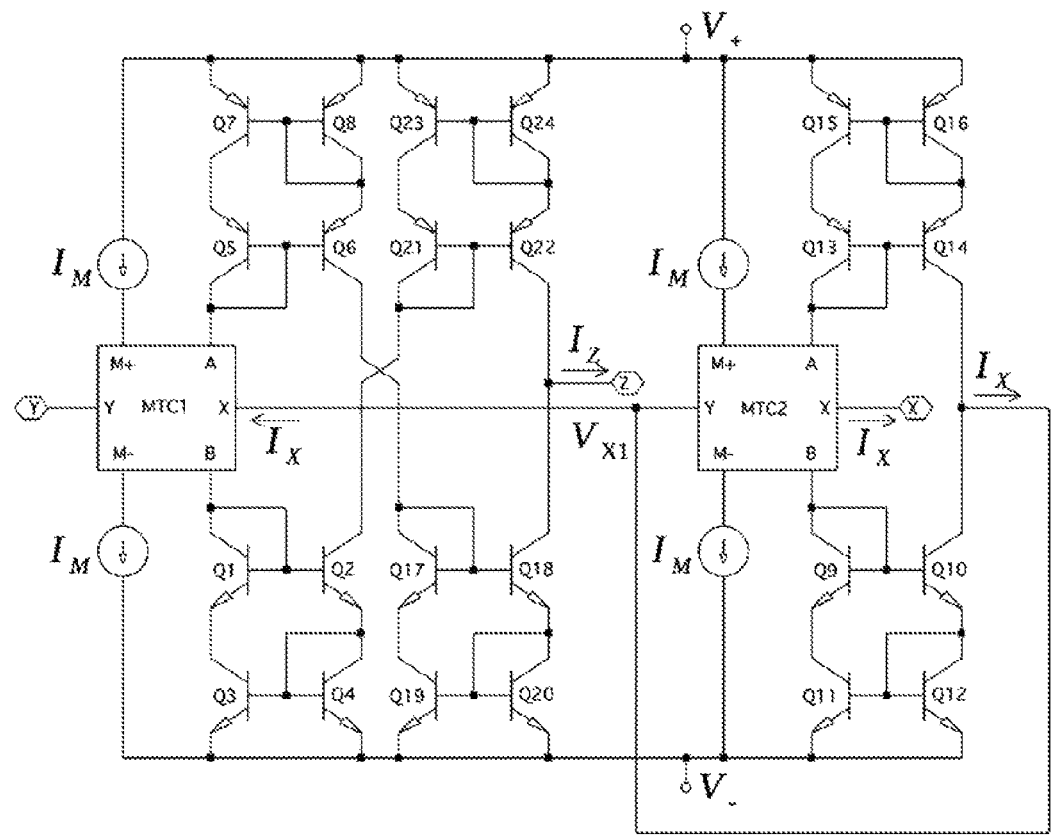
FIG. 6 depicts a second generation positive current conveyor, in accordance with various embodiments described herein.
Figure 6:
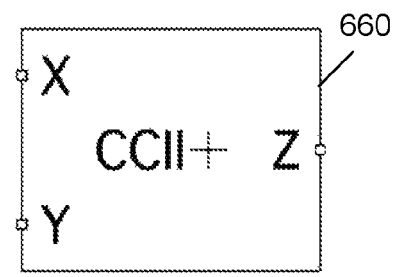

FIG. 6 depicts a Second Generation Positive Current Conveyor (CCII+). The direction of $I_Z$ relative to $I_X$ may be reversed by using two more current mirrors comprised of Q17-Q24 shown in FIG. 6. The relationship is now $V_X = V_Y$, and $I_X = I_Z$ which describes the behavior of a second generation positive current conveyor. The circuit symbol 660 represents the second generation negative current conveyor in various subsequent schematics.

Figure 7:
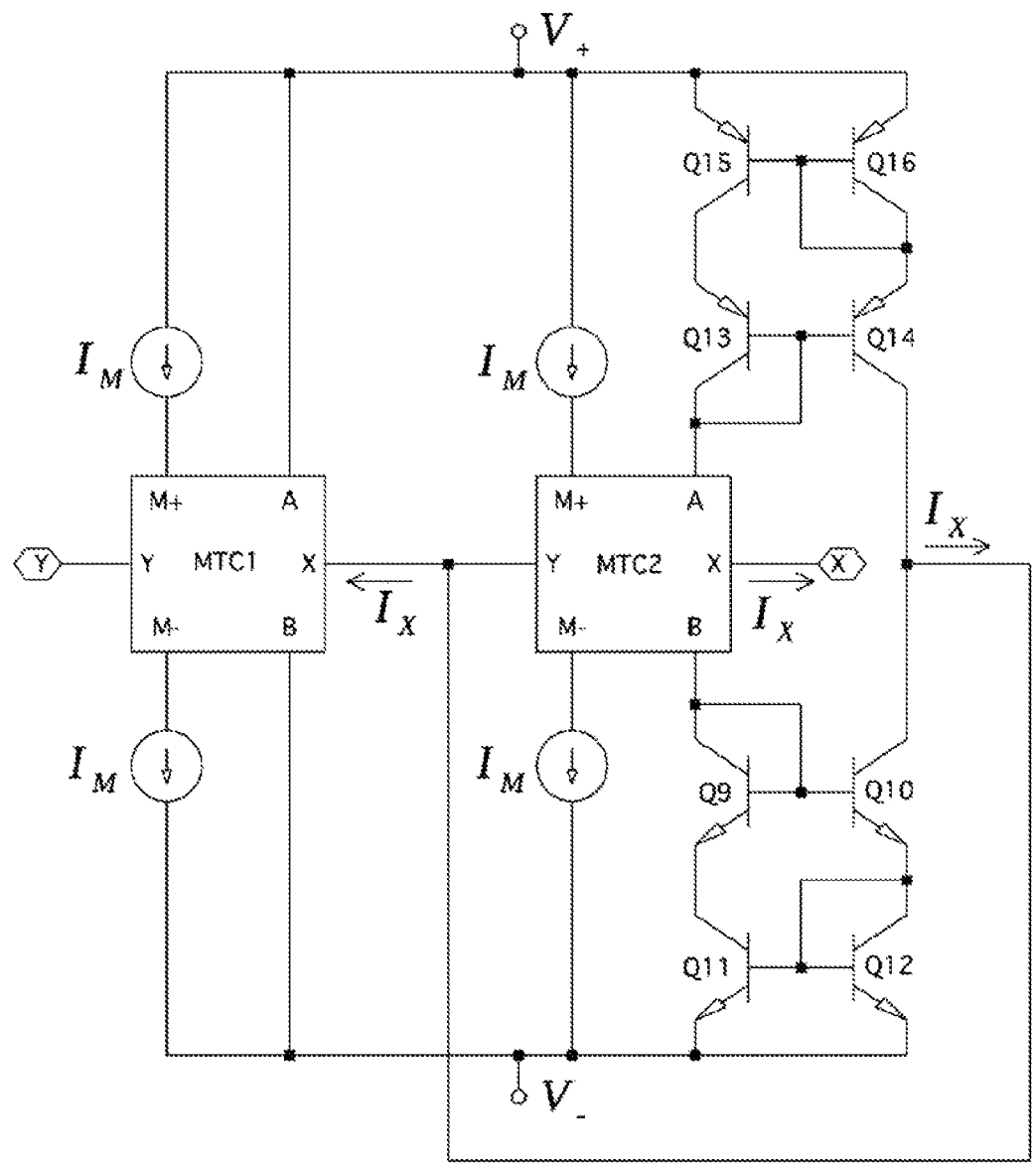
FIG. 7 depicts a voltage buffer amplifier, in accordance with various embodiments described herein.
Figure 7:
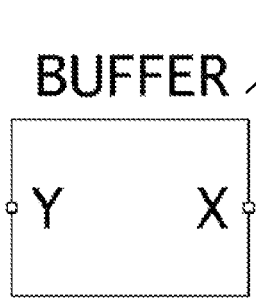

FIG. 7 depicts a voltage buffer amplifier. A voltage buffer amplifier may be built by recognizing that the current conveyor yields the relationship $V_X = V_Y$. Since nothing is done with the current that the load draws, FIG. 4 may be used and the current mirrors made up of Q1-Q8 (as shown in FIG. 4) may be dismantled. This circuit symbol 760 represents the voltage buffer amplifier in various subsequent schematics.

Figure 8:
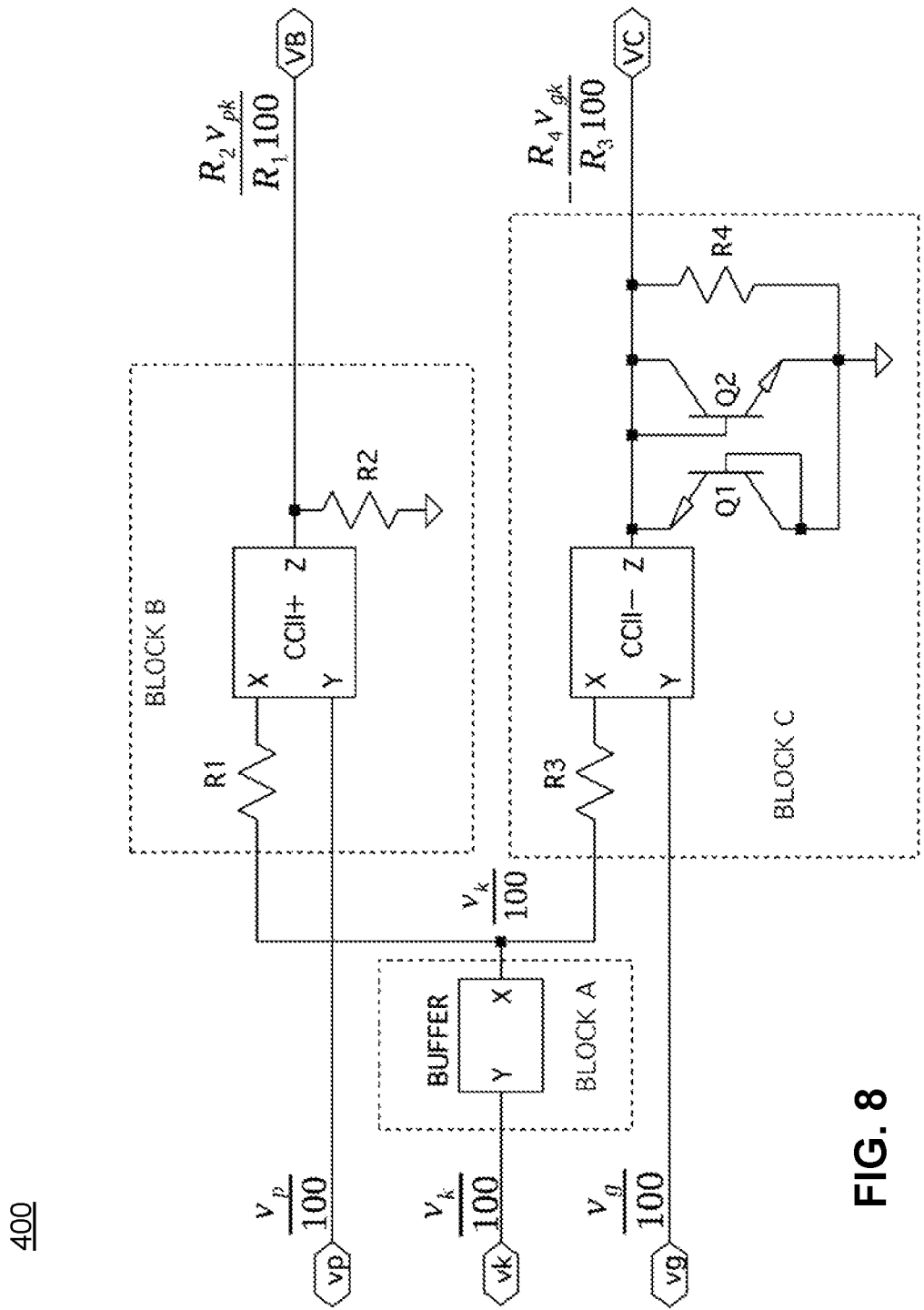
FIG. 8 depicts a preliminary circuit 400 including Block A, Block B, and Block C. Preliminary circuit is shared by a grid current emulator circuit and a plate current emulator circuit.

FIG. 8 depicts a preliminary circuit 400 including Block A, Block B, and Block C. Preliminary circuit 400 is shared by grid current emulator circuit 320 and plate current emulator circuit 340.

Block A includes a voltage buffer which sustains voltage $$\dfrac{v_k}{100}$$

from Y to X and allows it to drive a load.

Block B includes a CCII+ that has voltage $$\dfrac{v_p}{100}$$

at Y and produces the voltage $$\dfrac{R_2 v_{pk}}{R_1 100}$$

at Z.
This voltage will drive two high impedance nodes, and is labeled as node $V_B$.

Block C includes a CCII− that has voltage $$\dfrac{v_g}{100}$$

at Y and produces the voltage $$-\dfrac{R_4 v_{gk}}{R_3 100}$$

at Z.
This voltage will drive three high impedance nodes, and is labeled as node $V_C$. Q1 and Q2 are in place to limit the voltage between ≈−0.6V and ≈+0.6V so as to not overload the circuit further downstream. The temperature dependence of using the transistors in this way is of no consequence since in this case the valid computational range is far below these limiting values so as not to affect the accuracy in any significant way, given that some attention is paid to how much gain this stage has and how the next stages it feeds are setup.

Figure 9:
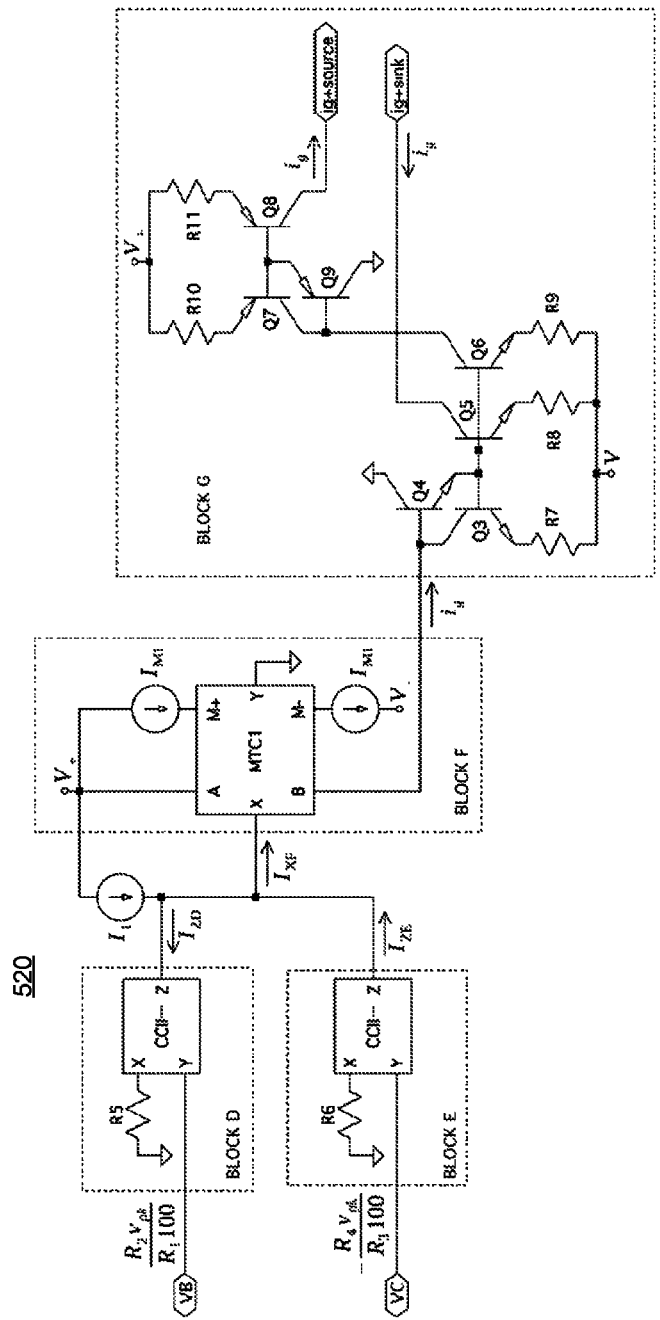
FIG. 9 depicts a schematic of an example implementation of a grid current emulator circuit for a computational circuit, in accordance with an embodiment of the present disclosure.

FIG. 9 depicts a schematic of an example implementation of a grid current emulator circuit 520 for computational circuit 100 (depicted in FIG. 3A), in accordance with an embodiment of the present disclosure. The particular embodiment shown in FIG. 9 is designed to emulate the grid current characteristics of any triode vacuum tube. As will be understood by those having ordinary skill in the art, other implementations of grid current emulator circuits 320 described in FIG. 3A (other than grid current emulator circuit 520 depicted in FIG. 9) are possible and are explicitly contemplated herein. Other implementations of grid current emulator circuits 320 may be designed by developing any fitting mathematical model for grid current as a function of $v_{gk}$ and $v_{pk}$, and designing any analog circuit that computes an emulated grid current according to this model. Additionally, as will be understood by those having ordinary skill in the art, the particular arrangement of components shown in grid current emulator circuit 520 in FIG. 9 is but one example of an implementation of circuitry effective to emulate a grid current of a triode vacuum tube. A nearly endless number of equivalent circuits, featuring alternate arrangements of components and/or different components, may be used to produce an emulated grid current as a function of $v_{gk}$ and $v_{pk}$. The particular implementation shown in FIG. 9 is but one example of such a circuit.

The following paragraphs include descriptions of the internal circuitry for the voltage dependent current source emulating grid current depicted in FIG. 9.

Block D includes a CCII− with voltage at Y from node $V_B$ fed from block B where $$V_B = \dfrac{R_2 v_{pk}}{R_1 100}.$$

Placing $R_5$ from X to ground produces a current entering Z labeled $I_{ZD}$, where $$I_{ZD} = \dfrac{R_2 v_{pk}}{R_1 R_5 100}.$$

Block E includes a CCII− with voltage at Y from node $V_C$ fed from block C where $$V_C = -\frac{R_4 v_{gk}}{R_3 100}.$$

Placing $R_6$ from X to ground produces a current exiting Z labeled $I_{ZE}$ where $$I_{ZE} = \frac{R_4 v_{gk}}{R_3 R_6 100}.$$

Block F includes a Mixed Translinear Cell (MTC1) that has a current entering X labeled $I_{XF}$ where $I_{XF}=I_{ZE}-I_{ZD}+I_1$ and current of $I_{M1}$ entering $M_+$ and exiting $M_-$. A current is produced exiting B labeled $i_g$ where $$i_g = \frac{I_{XF} + \sqrt{(I_{XF})^2 + 4(I_{M1})^2}}{2}.$$

In Block G, current $i_g$ from block F enters Q3 and is mirrored into Q5 and Q6. Q7 mirrors $i_g$ into Q8 while changing its direction. The current entering Q5 corresponds to terminal "ig+sink" of grid current emulator circuit 320. The current exiting Q8 corresponds to terminal "ig+source" of grid current emulator circuit 320. Emitter degeneration resistors R7-R9 of equal value are in place to raise the output resistance of the output terminals.

Setting the Values of Static Current Sources and Resistances:

The expression for $I_{XF}$ is placed into expression for $i_g$ from block F and is set equal to equation (1):

$$\frac{I_{ZE} - I_{ZD} + I_1 + \sqrt{(I_{ZE} - I_{ZD} + I_1)^2 + 4(I_{M1})^2}}{2} =$$
$$\frac{(K_1 v_{pk} - K_2 v_{pk} + K_3) + \sqrt{(K_1 v_{gk} - K_2 v_{pk} + K_3)^2 + 4(K_4)^2}}{2} \mu A$$

The expressions for $I_{ZE}$, $I_{ZD}$, and $I_1$ are placed into the equation above and the following relationships can be asserted:

$$\frac{R_4}{R_3 R_6 100} = K_1 \mu A, \quad \frac{R_2}{R_1 R_5 100} = K_2 \mu A, \quad I_1 = K_3 \mu A, \quad I_{M1} = K_4 \mu A$$

Figure 10A:
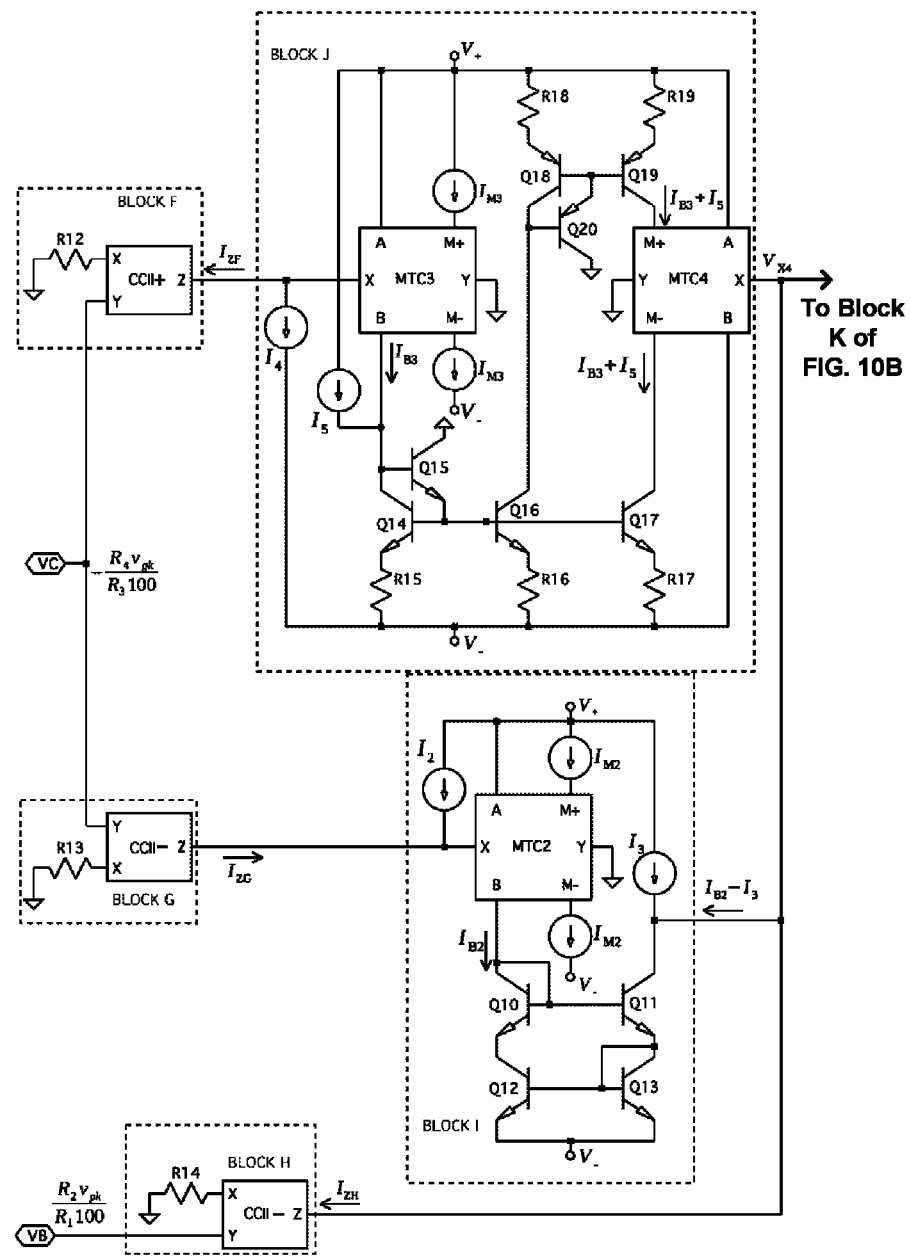
FIGS. 10A and 10B depict a schematic of an example implementation of a plate current emulator circuit for a computational circuit, in accordance with another example embodiment of the present disclosure.
Figure 10B:
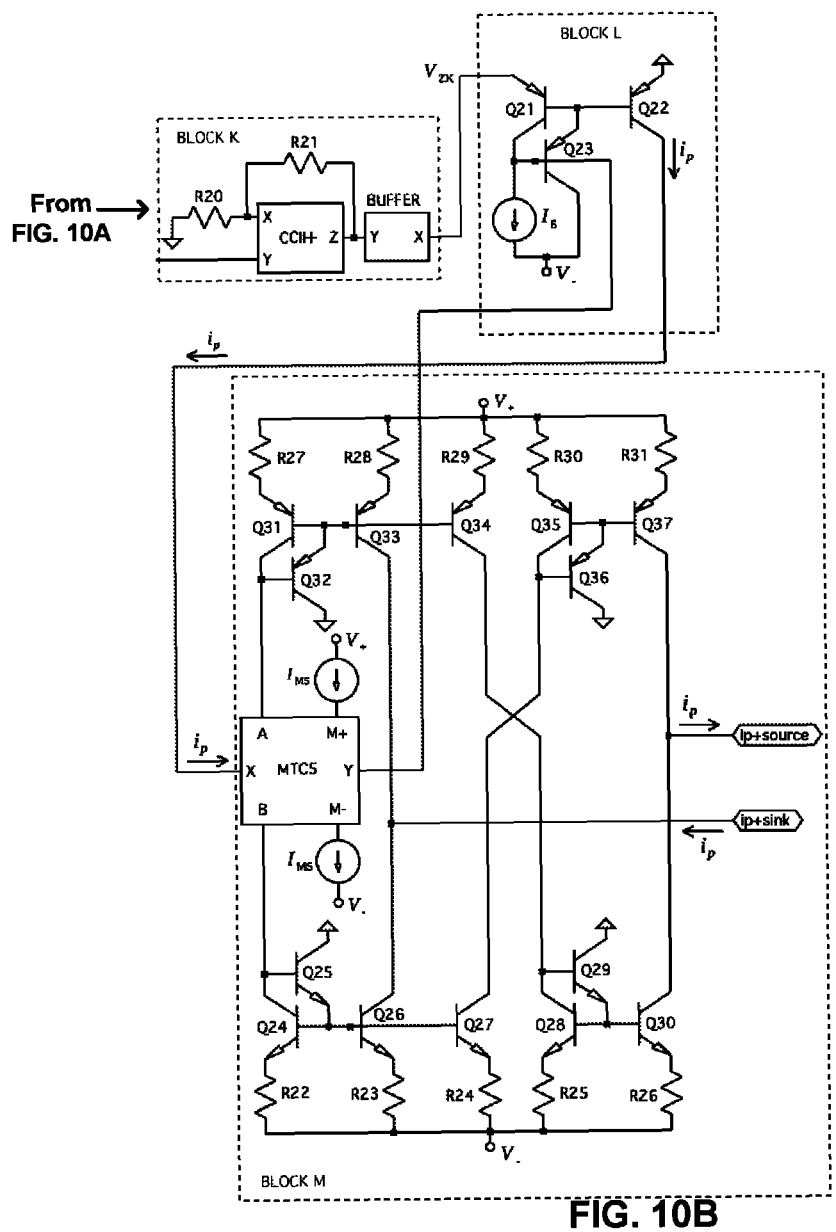

FIG. 10A and 10B depict a schematic of an example implementation of a plate current emulator circuit 540 for computational circuit 100 (depicted in FIG. 3A), in accordance with an embodiment of the present disclosure. The particular embodiment shown in FIGS. 10A and 10B is designed to emulate the plate current characteristics of any triode vacuum tube. Other implementations of plate current emulator circuits 340 described in FIG. 3A (other than plate current emulator circuit 440 depicted in FIGS. 10A and 10B) are possible and are explicitly contemplated herein. Other implementations of plate current emulator circuits 340 may be designed by developing any fitting mathematical model for plate current as a function of $v_{gk}$ and $v_{pk}$, and designing any analog circuit that computes an emulated plate current according to this model. Additionally, as will be understood by those having ordinary skill in the art, the particular arrangement of components shown in plate current emulator circuit 540 in FIGS. 10A and 10B is but one example of an implementation of circuitry effective to emulate a plate current of a triode vacuum tube. A nearly endless number of equivalent circuits, featuring alternate arrangements of components and/or different components, may be used to produce an emulated plate current as a function of $v_{gk}$ and $v_{pk}$. The particular implementation shown in FIGS. 10A and 10B is but one example of such a circuit.

The following paragraphs include descriptions of the internal circuitry for the voltage dependent current source emulating plate current depicted in FIGS. 10A and 10B.

Block F includes a CCII+ with voltage at Y from node $V_C$ fed from block C where $$V_C = -\frac{R_4 v_{gk}}{R_3 100}.$$

Placing $R_{12}$ from X to ground produces a current entering Z labeled $I_{ZF}$ where $$I_{ZF} = \frac{R_4 v_{gk}}{R_3 R_{12} 100}.$$

Block G includes a CCII- with voltage at Y from node $V_C$ fed from block C where $$V_C = -\frac{R_4 v_{gk}}{R_3 100}.$$

Placing $R_{13}$ from X to ground produces a current entering Z labeled $I_{ZG}$ where $$I_{ZG} = \frac{R_4 v_{gk}}{R_3 R_{13} 100}.$$

Block H includes a CCII- with voltage at Y from node $V_B$ fed from block B where $$V_B = \frac{R_2 v_{pk}}{R_1 100}.$$

Placing $R_{14}$ from X to ground produces a current entering Z labeled $I_{ZH}$ where $$I_{ZH} = \frac{R_2 v_{pk}}{R_1 R_{14} 100}.$$

Block I includes MTC2 that has current $I_{ZG}+I_2$ entering X and current $I_{M2}$ entering $M_+$ and exiting $M_-$. A current is produced exiting B labeled $I_{B2}$ where $$I_{B2} = \frac{(I_{ZG} + I_2) + \sqrt{(I_{ZG} + I_2)^2 + 4(I_{M2})^2}}{2}.$$

$I_{B2}$ is mirrored from Q10 and Q12 into Q11 and Q13. $I_3$ is connected to the collector of Q11 creating a current going into block I of $I_{B2}-I_3$.

In Block J MTC3 has current $I_{ZF}+I_4$ exiting X and current $I_{M3}$ entering $M_+$ and exiting $M_-$. A current is produced exiting B labeled $I_{B3}$ where $$I_{B3} = \frac{-(I_{ZF}+I_4)+\sqrt{(I_{ZF}+I_4)^2+4(I_{M3})^2}}{2}.$$

$I_5$ is added to $I_{B3}$ and their sum is mirrored from Q14 into Q16 and Q17 the copied from Q18 into Q19. Emitter degeneration resistors R15-R19 of equal value are in place to raise the output resistance at the collectors of Q16, Q17, and Q19. MTC4 has current $I_{B2}-I_3+I_{ZH}$ exiting X and current $I_{B3}+I_5$ entering $M_+$ and exiting $M_-$. A voltage is developed at X of MTC4 labeled as node $V_{X4}$ where $$V_{X4} = -v_T \ln\left(\frac{(I_{B2}-I_3+I_{ZH})+\sqrt{(I_{B2}-I_3+I_{ZH})^2+4(I_{B3}+I_5)^2}}{2(I_{B3}+I_5)}\right).$$

Block K includes a CCII+ that has a voltage at Y of $V_{X4}$ producing a voltage at Z of $$V_{X4}\left(1+\frac{R_{21}}{2R_{20}}\right).$$

The voltage buffer amplifier produces the preceding voltage at the X terminal and is labeled $V_{ZK}$ where:

$$V_{ZK} = V_{X4}\left(1+\frac{R_{21}}{2R_{20}}\right) =$$
$$-v_T \ln\left(\frac{(I_{B2}-I_3+I_{ZH})+\sqrt{(I_{B2}-I_3+I_{ZH})^2+4(I_{B3}+I_5)^2}}{2(I_{B3}+I_5)}\right)\left(1+\frac{R_{21}}{2R_{20}}\right).$$

Block L includes an exponential amplifier consisting of Q21, Q22, Q23 and $I_6$ where $I_6$ is the static current in the collector of Q21 and the collector current of Q22 has been labeled as $i_p$. Applying KVL from the emitter of Q21 to the emitter of Q22 yields $$V_{ZK} - v_T \ln\left(\frac{I_6}{I_{SP}}\right) + v_T \ln\left(\frac{i_p}{I_{SP}}\right) = 0.$$

Substituting the expression for $V_{ZK}$ in the preceding equation and simplifying produces $$i_p = I_6\left(\frac{(I_{B2}-I_3+I_{ZH})+\sqrt{(I_{B2}-I_3+I_{ZH})^2+4(I_{B3}+I_5)^2}}{2(I_{B3}+I_5)}\right)^{\left(1+\frac{R_{21}}{2R_{20}}\right)}.$$

Block M includes MTC5 with $i_p$ entering X and the collector voltage of Q21 at Y which places a voltage close to Y at the collector of Q22 minimizing the Early effect on the exponential amplifier. Q24-Q37 provide opposing directions of the current $i_p$ at X. The current entering the intersection of the collectors Q26 and Q33 corresponds to terminal "ip+sink" of plate current emulator circuit 340. The current exiting the intersection of the collectors Q30 and Q37 corresponds to terminal "ip+source" of plate current emulator circuit 340. Emitter degeneration resistors R22-R31 of equal value are in place to raise the output resistance of the output terminals.

Setting the Values of Static Current Sources and Resistances:

The expression for $i_p$ from the description of block L and is set equal to equation 2:

$$I_6\left(\frac{(I_{B2}-I_3+I_{ZH})+\sqrt{(I_{B2}-I_3+I_{ZH})^2+4(I_{B3}+I_5)^2}}{2(I_{B3}+I_5)}\right)^{\left(1+\frac{R_{21}}{2R_{20}}\right)} =$$
$$K_5\left(\frac{(v_{pk}-v_\pi)+\sqrt{(v_{pk}-v_\pi)^2+4(v_\lambda)^2}}{2v_\lambda}\right)^P \text{mA}.$$

The power term P is solved for by equating $$P = \left(1+\frac{R_{21}}{2R_{20}}\right)$$

and $I_6$ is set to $K_5$mA.

Substituting in expressions for $I_{B2}$, $I_{ZH}$, $I_{B3}$, $v_\pi$, and $v_\lambda$ and simplifying yields:

$$\frac{R_2 v_{pk}}{R_1 R_{14} 100} + \frac{(I_{ZG}+I_2)+\sqrt{(I_{ZG}+I_2)^2+4(I_{M2})^2}}{2} - I_3$$
$$\frac{-(I_{ZF}+I_4)+\sqrt{(I_{ZF}+I_4)^2+4(I_{M3})^2}}{2} + I_5 =$$

$$v_{pk} + \frac{(K_6 v_{gk}+K_7)+\sqrt{(K_6 v_{gk}+K_7)^2+4(K_8)^2}}{2} - K_9$$
$$\frac{(K_{10} v_{gk}+K_{11})+\sqrt{(K_{10} v_{gk}+K_{11})^2+4(K_{12})^2}}{2} + K_{13}$$

After substituting in the expression for $I_{ZF}$ and $I_{ZG}$ the following can be deduced:

$$\frac{R_2 R_3 R_{12}}{R_1 R_4 R_{14}} = -\frac{1}{K_{10}}, -\frac{R_2}{100 I_4 R_1 R_{14}} = \frac{1}{K_{11}}, \frac{R_2}{100 I_{M3} R_1 R_{14}} = \frac{1}{K_{12}},$$
$$\frac{R_2}{100 I_5 R_1 R_{14}} = \frac{1}{K_{13}}$$
$$-\frac{R_{12}}{R_{13}} = \frac{K_6}{K_{10}}, -\frac{I_2}{I_4} = \frac{K_7}{K_{11}}, \frac{I_{M2}}{I_{M3}} = \frac{K_8}{K_{12}}, \frac{I_3}{I_5} = \frac{K_9}{K_{13}}$$

Figure 11:
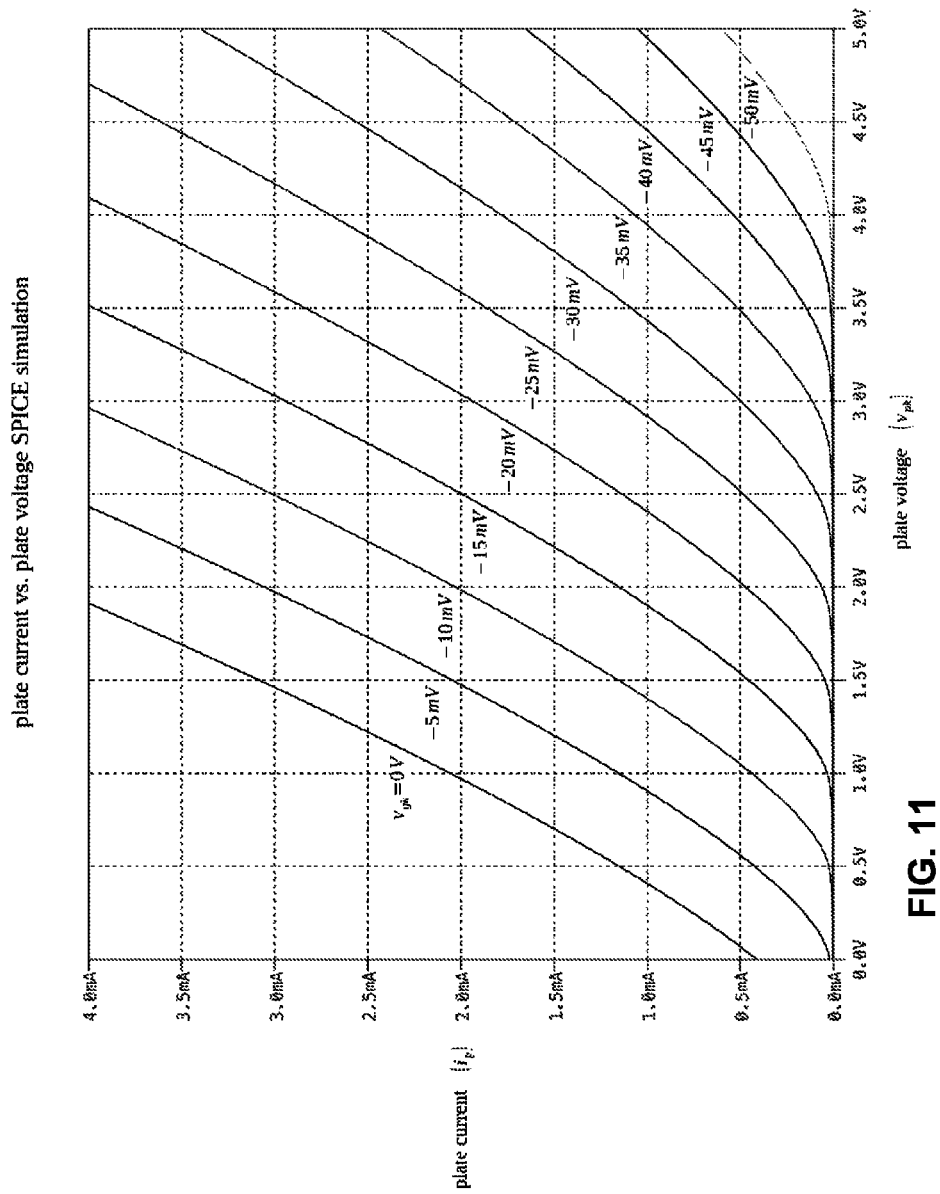
FIG. 11 depicts a simulation of a plate current emulator circuit, in accordance with an embodiment of the present disclosure.

Spice Simulation of Plate Current Emulator 340:

FIG. 11 depicts the results of a Spice simulation of plate current emulator circuit 340. Node k was grounded, Node p was swept from 0 to 5V for each voltage at Node g from 0 to −50 mV in steps of 5 mV. The values for each circuit component respecting the necessary constants $K_1$-$K_{13}$ and P to emulate a SYLVANIA 12AX7 were used. The following values used were:

$V_+$=15V, $V_-$=−15V, $R_1$=1 k$\Omega$, $R_2$=1 k$\Omega$, $R_3$=1 k$\Omega$, $R_4$=5.55 k$\Omega$, $R_{12}$=3.83 k$\Omega$, $R_{13}$=48 $\Omega$ $R_{14}$=1 k$\Omega$, $R_{15}$-$R_{19}$=1 k$\Omega$, $R_{20}$=500 $\Omega$, $R_{21}$=400 $\Omega$, $R_{22}$-$R_{31}$=1 k$\Omega$ $I_2$=10.47 mA, $I_{M2}$=5.859 mA, $I_3$=12.648 mA, $I_4$=27 $\mu$A, $I_5$=65 $\mu$A, $I_{M3}$=11 $\mu$A, $I_6$=30 $\mu$A Among other potential benefits, a system in accordance with the present disclosure may provide for compact circuitry effective to emulate the electrical characteristics of a triode vacuum tube in terms of plate, grid, and cathode voltages and currents. When used in the context of a guitar amplifier, the triode tube emulator circuits described herein may be effective to accurately emulate the distortion profiles and sound produced using a traditional vacuum tube. Additionally, circuitry, as described herein, may be inexpensive relative to traditional triode vacuum tubes such as the SYLVANIA 12AX7 tube. Additionally, the circuits described herein may have a longer lifespan relative to a particular corresponding vacuum tube.

The flowcharts and methods described herein show the functionality and operation of various implementations. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processing component in a computer system. If embodied in hardware, each block may represent a circuit or a number of interconnected circuits to implement the specified logical function(s).

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described example(s) without departing substantially from the spirit and principles of the disclosure. All such modifications and variations are intended to be included herein within the scope of this disclosure and protected by the following claims.

What is claimed is:

1. An analog triode tube emulator circuit comprising:
a first node, a second node, and a third node;
a first circuit; and
a second circuit;
wherein the first node comprises:
    a first output coupled to the first circuit, wherein a first current flows into the first circuit at the first output, and wherein the first current results from a first voltage, a second voltage, and a third voltage; and
    a first input coupled to the first circuit and the second circuit, wherein the first voltage is applied to the first circuit and the second circuit at the first input;
wherein the second node comprises:
    a second output coupled to the second circuit, wherein a second current flows into the second circuit at the second output, and wherein the second current results from the first voltage, the second voltage, and the third voltage; and
    a second input coupled to the first circuit and the second circuit, wherein the second voltage is applied to the first circuit and the second circuit at the second input;
wherein the third node comprises:
    a third output coupled to the first circuit, wherein the first current flows out of the first circuit at the third output into the third node;
    a fourth output coupled to the second circuit, wherein the second current flows out of the second circuit at the fourth output into the third node;
    a third input coupled to the first circuit and the second circuit, wherein the third voltage is applied to the first circuit and the second circuit at the third input; and
    a fifth output from the third node, wherein a third current flows through the fifth output, wherein the third current results from the first current and the second current flowing into the third node.

2. The analog triode tube emulator circuit of claim 1, further comprising:
a first capacitor coupled between the first node and the second node;
a second capacitor coupled between the first node and the third node; and
a third capacitor coupled between the second node and the third node.

3. The analog triode tube emulator circuit of claim 2, wherein:
the first capacitor is effective to emulate a first parasitic capacitance between a grid and a plate of a vacuum tube;
the second capacitor is effective to emulate a second parasitic capacitance between the grid and a cathode of the vacuum tube; and
the third capacitor is effective to emulate a third parasitic capacitance between the plate and the cathode of the vacuum tube.

4. The analog triode tube emulator circuit of claim 1, wherein currents at the first node satisfy the equation:

$$i_g = \frac{(K_1 v_{gk} - K_2 v_{pk} + K_3) + \sqrt{(K_1 v_{gk} - K_2 v_{pk} + K_3)^2 + 4(K_4)^2}}{2} \mu A;$$

wherein:
$i_g$ represents the first current;
$v_{gk}$ represents a first voltage difference between the first node and third node;
$v_{pk}$ represents a second voltage difference between the second node and the third node; and
$K_1$, $K_2$, $K_3$, and $K_4$ are triode tube constants.

5. The analog triode tube emulator circuit of claim 1, wherein currents at the second node satisfy the equation:

$$i_p = K_5 \left( \frac{(v_{pk} - v_\pi) + \sqrt{(v_{pk} - v_\pi)^2 + 4(v_\lambda)^2}}{2 v_\lambda} \right)^P mA \text{ where:}$$

$$v_\pi = -\frac{(K_6 v_{gk} + K_7) + \sqrt{(K_6 v_{gk} + K_7)^2 + 4(K_8)^2}}{2} + K_9, \text{ and}$$

$$v_\lambda = \frac{(K_{10} v_{gk} + K_{11}) + \sqrt{(K_{10} v_{gk} + K_{11})^2 + 4(K_{12})^2}}{2} + K_{13};$$

wherein:
$i_p$ represents the second current;
$v_{gk}$ represents a first voltage difference between the first node and third node;
$v_{pk}$ represents a second voltage difference between the second node and the third node; and
$K_5$, $K_6$, $K_7$, $K_8$, $K_9$, $K_{10}$, $K_{11}$, $K_{12}$, and $K_{13}$ are triode tube constants.

6. The analog triode tube emulator circuit of claim 1, wherein currents at the third node satisfy the equation:

$$i_k = i_p + i_g;$$

wherein:
$i_k$ represents the third current;
$i_p$ represents the second current; and
$i_g$ represents the first current.

7. An analog vacuum tube emulator circuit comprising:
a first circuit effective to:
  receive, at a first input of the first circuit, a first voltage;
  receive, at a second input of the first circuit, a second voltage;
  receive, at a third input of the first circuit, a third voltage;
  develop, at a fourth input of the first circuit, a first current based on the first voltage, the second voltage, and the third voltage; and
  output the first current to an output node;
a second circuit effective to:
  receive, at a fifth input of the second circuit, the first voltage;
  receive, at a sixth input of the second circuit, the second voltage;
  receive, at a seventh input of the second circuit, the third voltage;
  develop, at an eighth input of the second circuit, a second current based on the first voltage, the second voltage, and the third voltage; and
  output the second current to the output node.

8. The analog vacuum tube emulator circuit of claim 7, wherein:
the first voltage is proportional to a grid voltage of a first vacuum tube to be emulated by the vacuum tube emulator circuit;
the second voltage is proportional to a plate voltage of the first vacuum tube; and
the third voltage is proportional to a cathode voltage of the first vacuum tube.

9. The analog vacuum tube emulator circuit of claim 7, wherein:
the first current is proportional to a grid current of a first vacuum tube to be emulated by the vacuum tube emulator circuit, the grid current being developed in response to a grid voltage applied to a grid of the first vacuum tube, a plate voltage applied to a plate of the first vacuum tube, and a cathode voltage applied to a cathode of the first vacuum tube.

10. The analog vacuum tube emulator circuit of claim 9, wherein:
the second current is proportional to a plate current of the first vacuum tube, the plate current being developed in response to the grid voltage applied to the grid, the plate voltage applied to the plate, and the cathode voltage applied to the cathode.

11. The analog triode tube emulator circuit of claim 7, wherein the first circuit comprises:
a first stage comprising a first negative current conveyor;
a second stage comprising a second negative current conveyor;
a third stage comprising a mixed translinear cell, the third stage electrically coupled to the first stage and the second stage; and
a fourth stage comprising a current mirror electrically coupled to the mixed translinear cell and a second current mirror.

12. An analog vacuum tube emulator circuit comprising:
a first circuit effective to:
  receive, at a first input of the first circuit, a first voltage;
  receive, at a second input of the first circuit, a second voltage;
  receive, at a third input of the first circuit, a third voltage;
  develop, at a fourth input of the first circuit, a first current based on the first voltage, the second voltage, and the third voltage, wherein the first current is proportionate to a grid current of a vacuum tube to be emulated by the vacuum tube emulator circuit when the first voltage is applied at the grid of the vacuum tube, the second voltage is applied at the plate of the vacuum tube, and the third voltage is applied at the cathode of the vacuum tube; and
  output the first current to an output node;
a second circuit effective to:
  receive, at a fifth input of the second circuit, the first voltage;
  receive, at a sixth input of the second circuit, the second voltage;
  receive, at a seventh input of the second circuit, the third voltage;
  develop, at an eighth input of the second circuit, a second current based on the first voltage, the second voltage, and the third voltage, wherein the second current is proportionate to a plate current of the vacuum tube to be emulated by the vacuum tube emulator circuit when the first voltage is applied at the grid of the vacuum tube, the second voltage is applied at the plate of the vacuum tube, and the third voltage is applied at the cathode of the vacuum tube; and
  output the second current to the output node.

13. The analog vacuum tube emulator circuit of claim 12, further comprising:
a first capacitor disposed between the fourth input of the first circuit and the output node; and
a second capacitor disposed between the eighth input of the second circuit and the output node.

14. The analog vacuum tube emulator circuit of claim 13, wherein the first capacitor is effective to emulate a first parasitic capacitance between the grid and the cathode of the vacuum tube and the second capacitor is effective to emulate a second parasitic capacitance between the plate and the cathode of the vacuum tube.

* * * * *